United States Patent [19]

Talmy et al.

[11] Patent Number: 5,047,387

[45] Date of Patent: Sep. 10, 1991

[54] METHOD FOR THE SELECTING SUPERCONDUCTING POWDERS

[75] Inventors: Inna G. Talmy, Silver Spring; Curtis A. Martin, Germantown; Kurt P. Scharnhorst, Columbia, all of Md.

[73] Assignee: The United States of America as represented by the Secretary of the Navy, Washington, D.C.

[21] Appl. No.: 145,172

[22] Filed: Jan. 19, 1988

[51] Int. Cl.[5] .......... H01L 39/00

[52] U.S. Cl. .......... 505/1; 505/932; 505/933; 209/2; 209/11; 209/212

[58] Field of Search .......... 209/2, 11, 40, 212, 209/478; 252/518, 521; 505/1, 932, 933

[56] References Cited

U.S. PATENT DOCUMENTS

| | | | |
|---|---|---|---|
| 3,932,315 | 1/1976 | Sleight | 252/518 |
| 3,988,240 | 10/1976 | Fraas | 209/227 |
| 4,043,888 | 8/1977 | Gavaler | 204/192.24 |
| 4,478,711 | 10/1984 | Cohen et al. | 209/478 |
| 4,526,681 | 7/1985 | Friedlaender et al. | 505/933 |
| 4,565,624 | 1/1986 | Martinez | 209/478 |
| 4,743,364 | 5/1988 | Kyrazis | 209/212 |
| 4,828,685 | 5/1989 | Stephens | 505/932 |

OTHER PUBLICATIONS

Cava, R. J. et al., *Physical Renew Letters*, vol. 58, No. 16, pp. 1676–1679, Apr. 20, 1987.

Gurvitch, M. et al., *Applied Physics Letters*, vol. 51, No. 13, pp. 1027–1029, Sep. 28, 1987.

Gurvitch, M. et al., *Materials Research Society Symposium Proceedings*, vol. 99 (High Temperature Superconductors) Dec. 1987.

Barsoum et al., *Applied Physics Letters*, vol. 51, No. 23, Dec. 1987.

*Primary Examiner*—Stephen J. Lechert, Jr.

*Attorney, Agent, or Firm*—Kenneth E. Walden

[57] ABSTRACT

There is disclosed herein an invention for beneficiation of powered material having superconducting characteristics and processes for carrying it out. The invention involves introducing powdered superconducting material into the vertical field of a magnet wherein particles thereof are levitated according to the Meissner Effect. Particles which are more superconducting levitate at higher elevations or states above the magnet than do particles containing phases that are non-superconducting. Particles that are non-superconducting do not react at all in the magnetic field. Levitated particles are selectively harvested from whatever states desired.

14 Claims, 5 Drawing Sheets

MEISSNER EFFECT ILLUSTRATED

MEISSNER EFFECT ILLUSTRATED

METHOD FOR THE SELECTING SUPERCONDUCTING POWDERS

BACKGROUND OF THE INVENTION

This invention concerns beneficiation of superconducting material in powdered form by separating particles thereof which are more superconducting from those that are non-superconducting or contain substantial non-superconducting phases.

It has long been known that certain materials conduct electricity at very little loss at temperatures near absolute zero. Nearly half of the elements on the periodic chart, and a very wide range of compounds and alloys, exhibit some decrease in electrical resistance when their temperatures are reduced to near absolute zero.

Recently, there have been substantial advances made in discovering new materials or compounds that are superconducting. Certain metal oxides - materials which in the past had been considered electrical insulators - have been found to have superconducting characteristics at transition temperatures ($T_c$) well above absolute zero. This had led searches for still further compounds that will superconduct at even room temperature.

Present discoveries and developments lead the theory or understanding of just how recently discovered superconductors work. Understood or not, there is a common characteristic running through all superconducting materials. They levitate (float) in a sufficiently strong magnetic field. It was discovered that a superconducting metal, when cooled to below its critical temperature ($T_c$), expelled a magnetic field. A magnet will levitate over a superconducting material below its critical temperature. Conversely, a superconducting material, when cooled to below its critical temperature ($T_c$) will levitate in the magnetic field above either pole of a sufficiently strong magnet.

This effect, discovered in 1933 and known as the Meissner Effect, has been an interesting laboratory curiousity and found use in testing for superconductivity. Aspects of the principle are employed in the inventive process disclosed herein.

In a field unrelated to superconductivity, it is known to separate one metal from another by subjecting both to a magnetic field, wherein one is attracted by the field and other is not. This principle was employed as early as 1876 in U.S. Pat. No. 581,034 wherein gold-containing ore was passed through the presence of a magnetic field. More specifically, the process involved placing the ore above a bed of mercury, subjecting the ore to the influence of a magnetic field to draw the ore below the surface of the mercury, and removing the ore.

A process for separating relatively magnetic particles from relatively non-magnetic particles in a dry state is disclosed in more recent U.S. Pat. No. 4,478,711. In this process, particles flow past a magnet. The magnetic particles are diverted toward the magnetic, but are not retained by it, while non-magnetic particles continue along their original path. U.S. Pat. No. 4,565,624 discloses still another arrangement for separating magnetic ores from non-magnetic material. These processes are mentioned to illustrate examples in the art of using magnetic fields to separate magnetic ore from non-magnetic material such as soil or rock in which it is contained.

The present invention relates to a process for beneficiation of superconducting material in powdered form comprised of particles, grains, or granules having different superconducting characteristics. Particles, etc., which are more superconducting are harvested from other particles that are less superconducting or are non-superconducting. The invention employs a process for separating materials according to their relative superconductivity.

SUMMARY OF THE INVENTION

The present invention is concerned with beneficiation of superconducting material in powdered form by harvesting therefrom particles which are more superconducting from particles that are less superconducting (e.g., because of contained non-conducting phases) or from particles that are totally non-superconducting. Superconducting material in powdered form may often be comprised of particles which vary in superconducting quality. Some particles will be totally superconducting single phase, some totally non-superconducting, and some multi phase (while overall superconducting) will contain phases which are non-superconducting. The latter phases degrade the quality of that particle in particular, and, to a lesser degree, any material in which it appears.

It is, therefore, an object of the present invention to disclose a process for beneficiation of superconducting material.

It is another object of the present invention to disclose a process for beneficiation of superconducting material in powdered form by separating particles which are superconducting from particles which are non-superconducting and from particles which contain non-superconducting phases.

It is still another object of the invention to disclose a process of beneficiation by harvesting from superconducting material in powdered form particles, etc., which are more superconducting from particles which are less superconducting.

It is yet another object of the invention to beneficiate particles of material having superconducting characteristics from particles having less or non-superconducting characteristics by introducing a powder comprised of such particles into a vertical field of a strong magnet, whereby the more superconducting particles are levitated according to the Meissner Effect at elevation states and selectively harvested.

A final object of the invention is to form a superconductor by sintering particles of material having been subjected to the beneficiation process.

BRIEF DESCRIPTION OF THE DRAWING

The above objects and specification which follows will be more fully appreciated when considered in conjunction with reference to the drawings which illustrate the invention and arrangements for carrying it out.

DETAILED DESCRIPTION OF THE INVENTION AND PREFERRED PROCESSES THEREFOR

There follows a description of the invention and several arrangements for practicing the process.

Enormous strides have been made recently in superconducting materials. New compounds and alloys have been discovered which exhibit superconducting characteristics at temperatures much higher than previously known. Ceramics in the form of certain metal oxides, thought of in the past as insulators, have been found to be superconducting, and are now leading candidates. Further discoveries and developments are expected to lead to materials which are superconducting even at room temperature.

The present invention relates to a process for beneficiation of superconducting material in powdered form, whether superconducting at low critical temperatures ($T_c$) or at room temperature. Superconducting temperature is defined herein as the temperature at which a material is superconducting. The disclosed process is applicable to all superconducting materials, and is independent of temperature.

The present invention employs a long observed phenomenon, known as the Meissner Effect, as a step in separating particulate material according to its superconducting characteristics.

A superconducting material processed through the powdered form stage is made up of very fine size particles, grains or granules. As a whole, the material is superconducting, but individual particles or phases thereof may not be. It may be desired to enrich the material by selecting from the powder particles which exhibit high superconducting characteristics.

Figure 1:
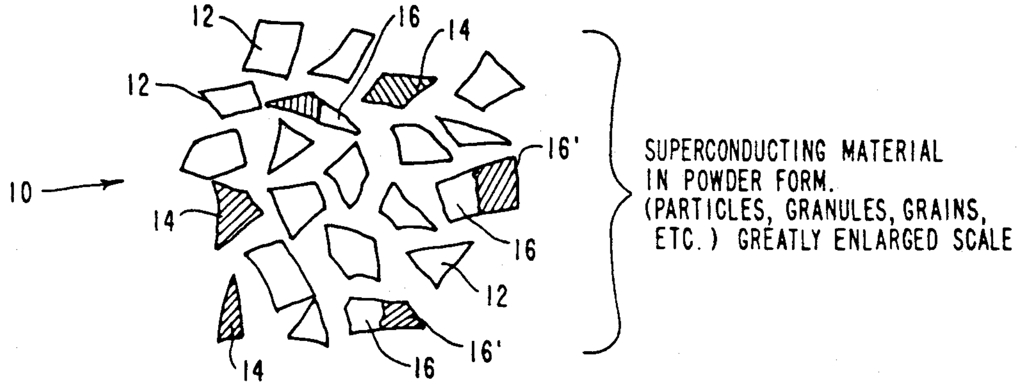
FIG. 1 is a large scale representation (approximately 2-5000×) of superconducting material in powdered form comprised of a mix of particles, grains, granules etc., some of which are comprised totally of single phase superconducting material, some comprised of multi phase superconducting material with phases which are non-superconductive, and others which are totally nonsuperconducting.

There is illustrated in FIG. 1, at greatly enlarged scale, a superconducting material 10 in powdered form comprised of particles of various sizes and characteristics. Some particles, such as those identified by numerals 12, are totally superconducting. Other particles, such as those identified by numerals 14, are non-superconducting. Still other particles, such as those identified by numerals 16, may be superconducting, but contain phases 16' that are non-superconducting. Further grinding of the powder into finer particles may break many multi-phase particles 16 into smaller particles which would be either totally superconducting or totally non-superconducting. But, powders of such fine particle size would be difficult to process.

Figure 2:
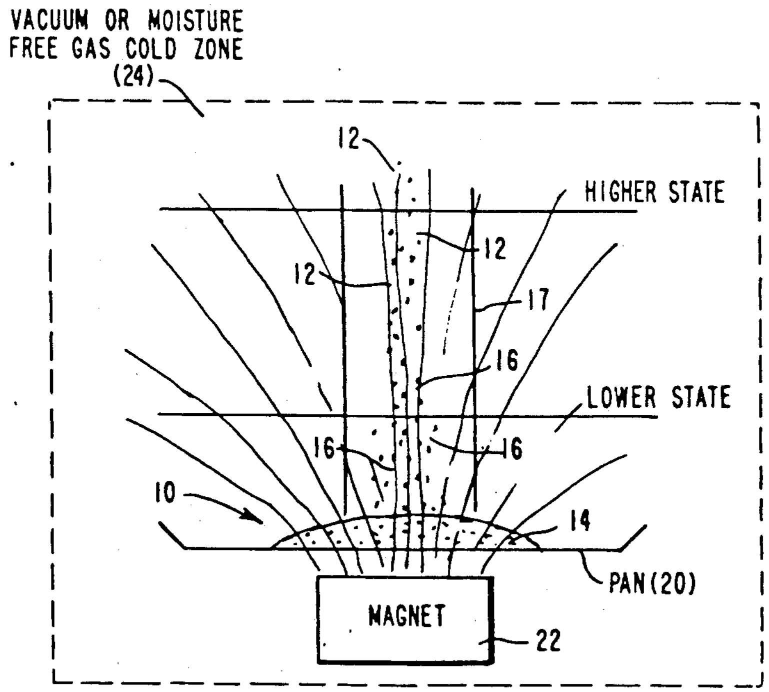
FIG. 2 is a representation of the principle of the invention wherein some particles of powdered superconducting material at superconducting temperature are levitated in a vertical magnetic field according to the Meissner Effect.

The principle of the invention is illustrated in FIG. 2 wherein superconducting material 10 in powdered form is contained on a non-magnetic pan 20 positioned over magnet 22. Particles 12, which are most superconducting are illustrated as levitated in the vertically directed magnetic field of magnet 22 at the highest elevation or state, while particles 16, which contain phases of non-superconducting material, levitate at a lower state. Particles 14, which are totally non-superconducting, are not levitated at all by the magnetic field. They remain in pan 20. To leviate and further process presently known materials according to the process disclosed herein, it is necessary that the material be maintained below its critical temperature ($T_c$), and disposed in a vacuum or moisture-free gas chamber (zone 24) to avoid icing. It is preferred to agitate particles 10 in pan 20 to allow them an opportunity to float free of an overlying mass of particles. Walls 17 of non-magnetic material may substantially enclose the particles to aid the particles toward a central position.

With continued discovery of materials which are superconducting at higher and higher temperature, it may be that cooling the material and maintaining a zone 24 will no longer be required.

The invention accomplishes beneficiation by harvesting levitated particles 12 or 16 from whatever state may be determined to provide particles of acceptable superconducting quality. The remainder are rejected, or collected for further processing. Additional representations of processes for carrying out the principle of the invention are made in FIGS. 3–10.

Figure 3:
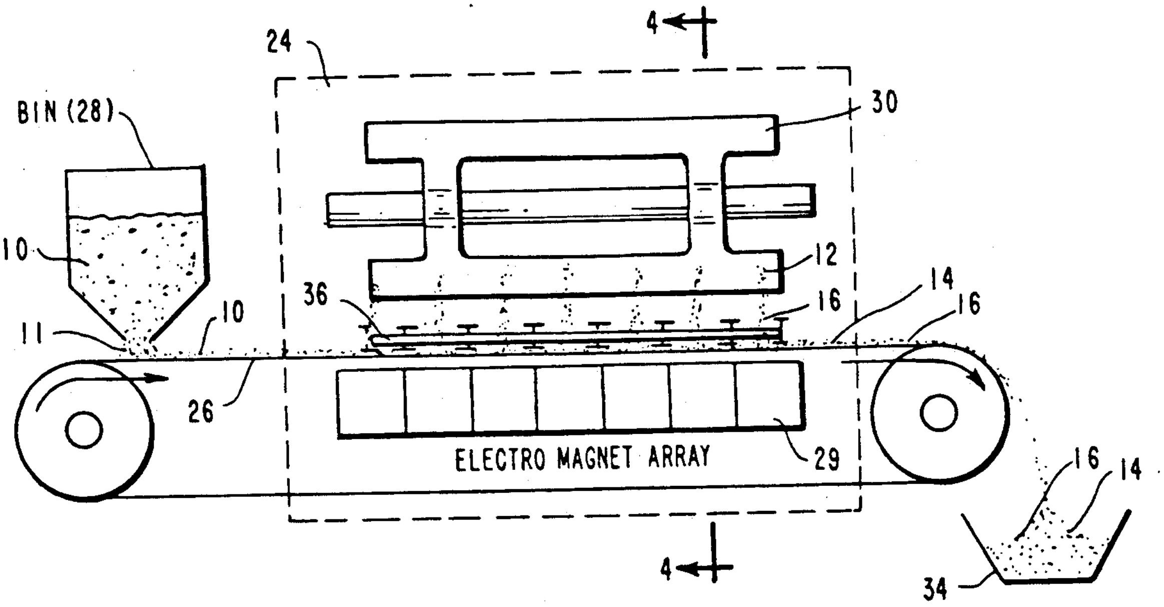
FIG. 3 illustrates one arrangement for carrying out the process of the invention on a production basis.
Figure 4:
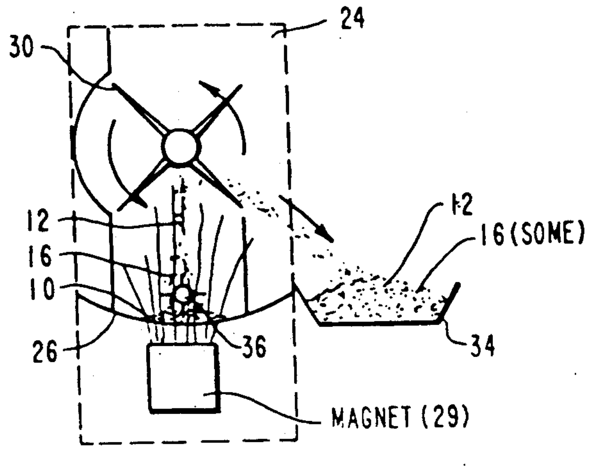
FIG. 4 is a cross-sectional representation of a portion of the arrangement of FIG. 3 taken generally along line 4—4.

Referring now to FIG. 3, there is illustrated a traveling non-magnetic conveyor 26 on which is deposited a stream 11 of powdered material 10 from bin 28. The conveyor carries powdered material 10 in a continuous line over a linear array of electromagnets 29. Superconducting material 10, as presently known, must be cooled to a temperature below its critical temperature ($T_c$). This is preferably accomplished by prior cooling of the material, or by passing the material through a vacuum or gas filled moisture-free cold zone 24. Once the cooled particles are under the influence of the vertical magnetic fields of magnets 29, they are levitated at states above the magnets in accordance with their superconducting quality and strength of the magnets. Harvesting of particles, such as those identified by the numerals 12, which are levitated around the higher state, may be by mechanical means, for example, such as by the sweep of arms or paddles 30 which are slowly rotated about their longitudinal axis. The "good" particles 12 are swept to one side of the conveyor 26 for collection in apparatus such as a pan or conveyor as illustrated in FIG. 4. Particles 16, levitated at lower states, settle back on the conveyor with particles 14 once they have passed beyond the influence of electromagnets 29 and fall into collecting bin 34 at the end of conveyor 26.

Figure 5:
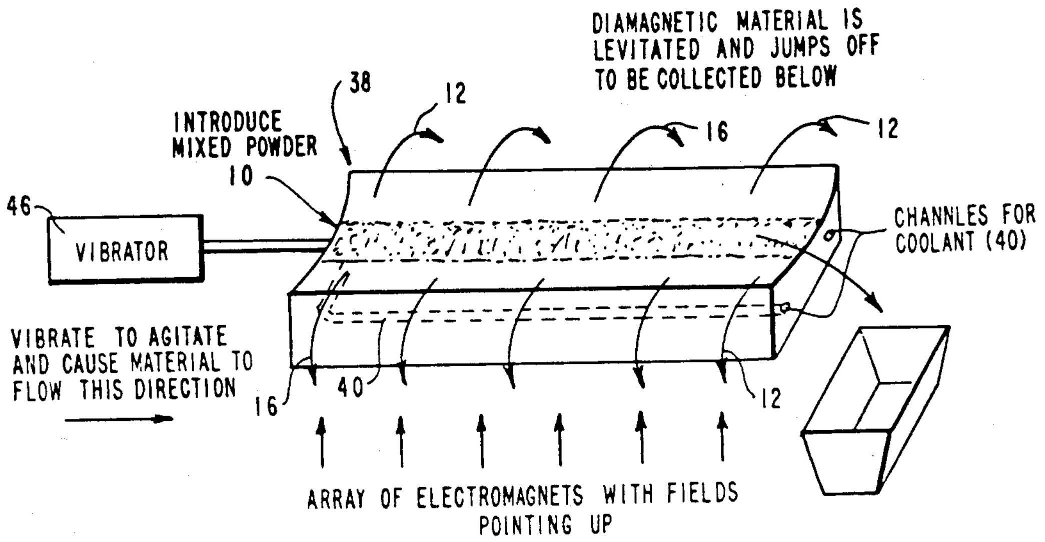
FIG. 5 illustrates another arrangement for carrying out the process of the invention.
Figure 7:
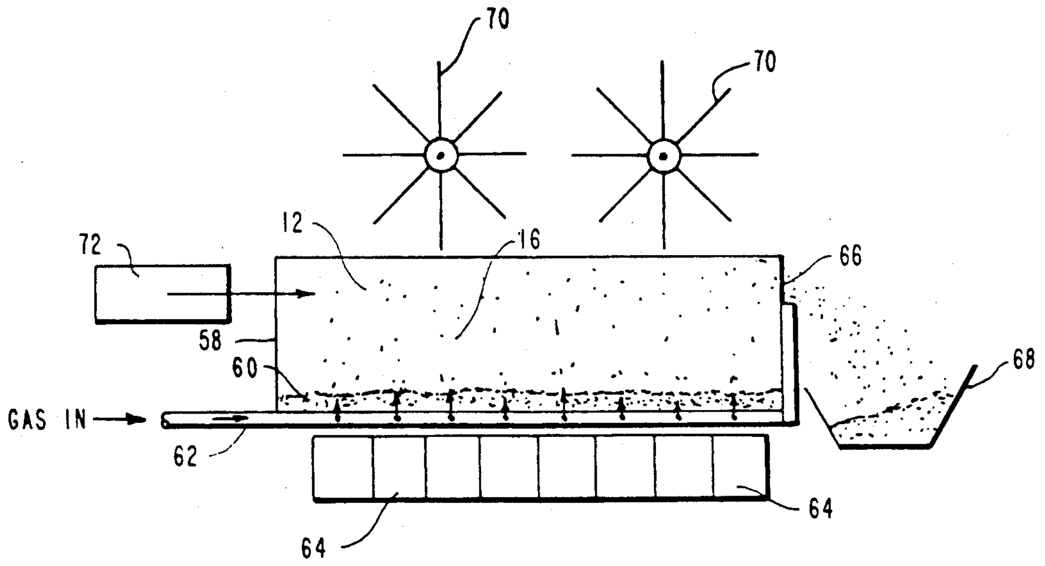
FIG. 7 is a cross-sectional representation of still another employment for carrying out the process of the invention.

It is desirable to physically agitate powdered mixtures 10 while on the conveyor and over electro-magnets 29 in order that all particles be exposed for an opportunity to levitate in the magnetic field. Agitation may be accomplished in numerous ways, for example, rotating stirrer 36 is employed in FIGS. 3 and 4, while a fluidized bed is illustrated in FIG. 7. In FIG. 5, the whole conveyor chute is vibrated to agitate the powdered material and also propel it along linearly.

Figure 6:
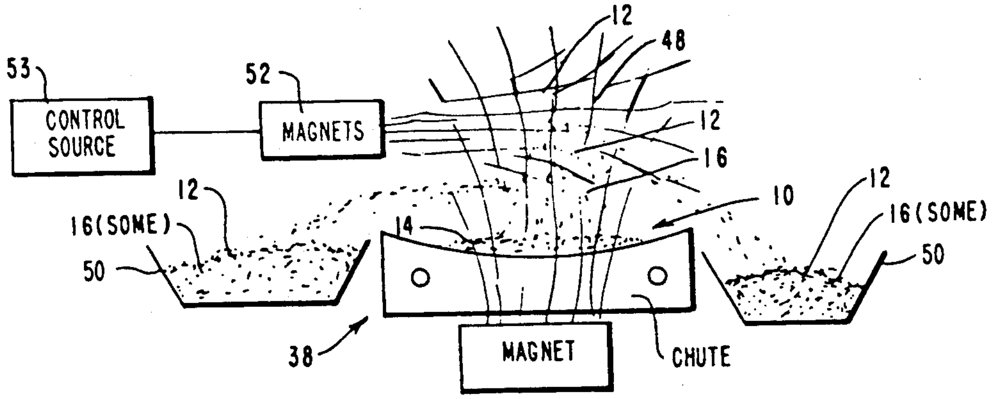
FIG. 6 is an end view representation of the FIG. 5 arrangement, and further illustrating a pulsed magnet in position relative thereto.
Figure 6A:
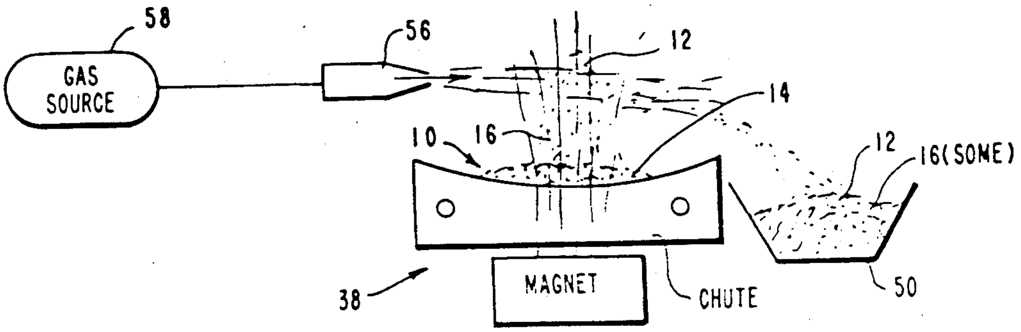
FIG. 6*a* is an alternative arrangement of FIG. 6 wherein gas jets replace the pulsed magnet.

In the FIG. 5 embodiment, conveyor or chute 38, of non-magnetic substance is provided with internal channels 40 for conducting coolant throughout for reducing or maintaining powered superconducting particles 10 at a temperature below their critical temperature. Powdered particles 10 are introduced at one end of conveyor 38. The chute is vibrated by mechanical apparatus 46, or other means which may include, but is not limited to solenoids or ultrasonics, for agitating or stirring the particles 10, and moving them along. An array of electromagnets, (not illustrated, but comparable to electromagnets 29 in FIG. 3,) with vertically directed fields, are provided to levitate the superconducting particles. Particles 12 and 16, exhibiting sufficient superconducting qualities, are levitated. Generally the levitated particles are unstable and soon find that they are propelled over the side of conveyor 38 by bent magnetic field lines 48 and collected in trays 50, as illustrated in FIG. 6. An array of pulsed magnets 52 under control source 53 may be provided on either side and above chute 38 to propel the particles to the sides for collection in trays 50. FIG. 6*a* illustrates an alternate embodiment wherein levitated particles 12, 16 are propelled laterally out of their levitation state by moisture-free gas emitted by jet nozzle 56 supplied from gas source 58.

FIG. 7 illustrates a bin or container 58 of non-magnetic material wherein a bed 60 of powdered superconducting material is aerated by moisture-free gas admitted through piping 62. The air causes agitation or stirring of the particles to enhance their levitation above magnets 64. Means are provided for propelling higher state particles 12 and 16 toward one end of container or bin 58 where those particles higher than the bottom of opening 66 fall into bin 68. Numerous mechanical propelling means can be employed such as revolving paddles 70 or gas jet 72 to move the higher state particles toward opening 66.

Figure 8:
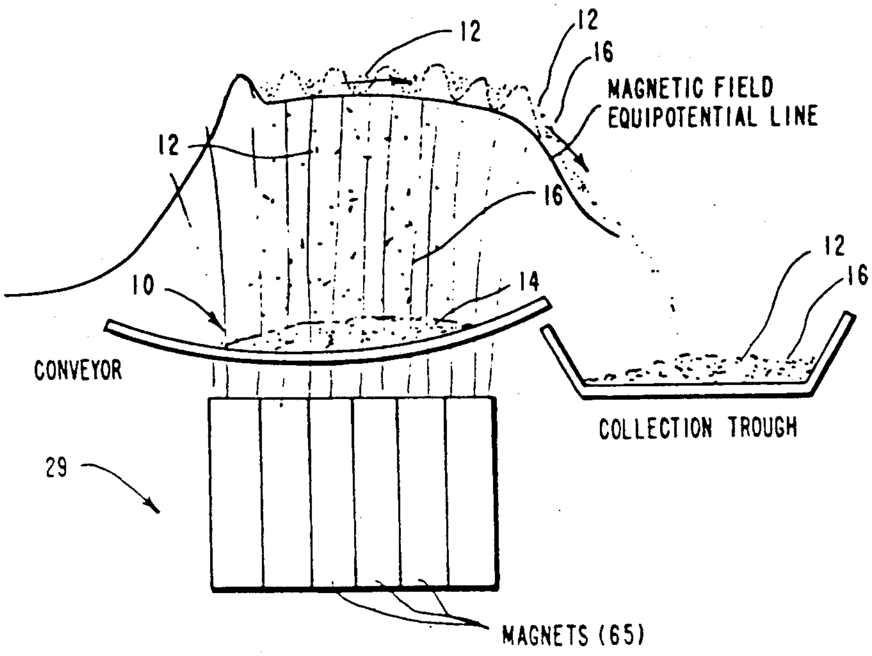
FIG. 8 illustrates a laterally moving peak pulse for sweeping levitated particles to one side.

In FIG. 8 there is illustrated a magnetic field equipotential line above electro-magnet 29, made up of a plurality of smaller electro-magnets 65 with their poles pointing upward. With the smaller magnets 65 energized to an appropriate magnitude to form an equipotential line, as illustrated in FIG. 8, which may be translated from, say left to right, by selective controlled energization of magnets 65 to cause a traveling wave to sweep levitated particles to one side for collection.

Figure 9:
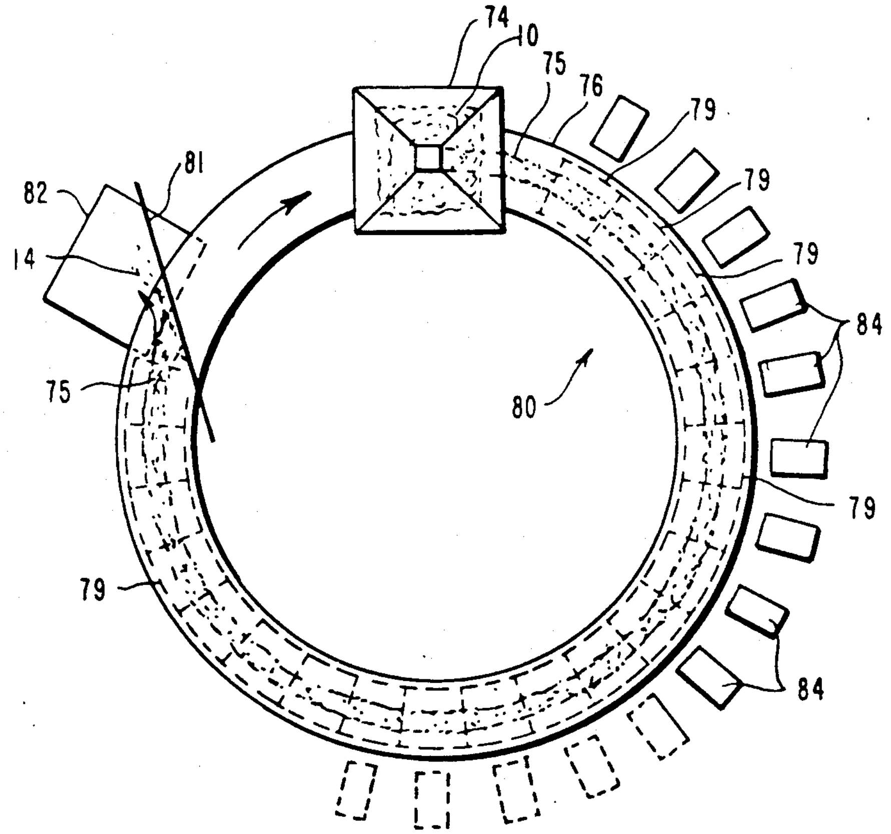
FIG. 9 illustrates in plan view still another arrangement for carrying out the process of the invention on a production basis.
Figure 10:
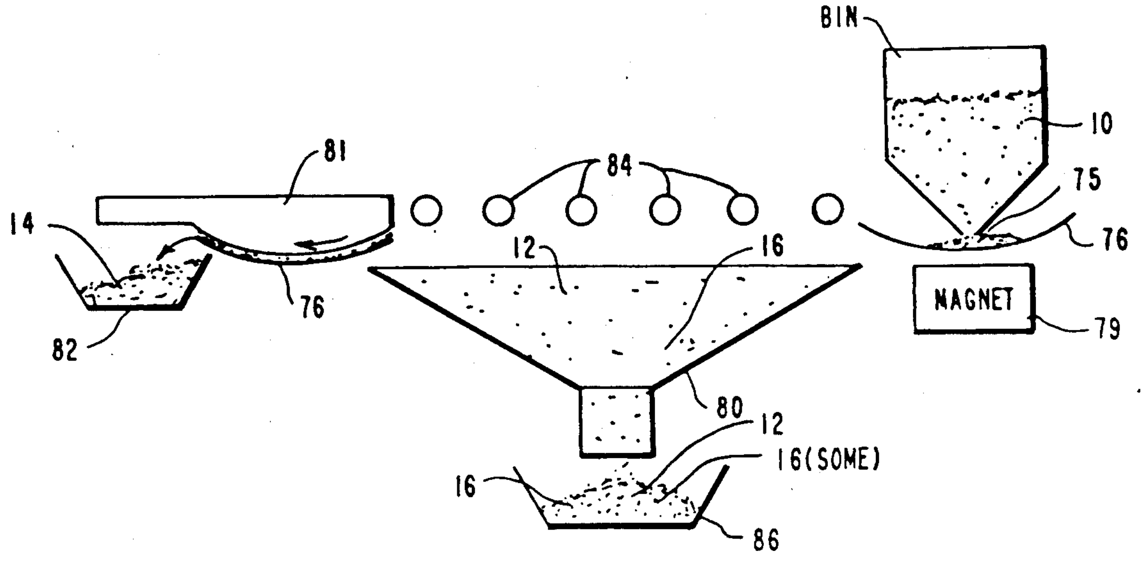
FIG. 10 is a general cross-sectional view of FIG. 9.

There is illustrated in FIG. 9 still another arrangement for carrying out the process. Binn 74 filled with superconducting particles 10 releases a stream 75 of the particles onto circular conveyor 76, formed of non-magnetic material, which travel over an underlying linear (including circular) array of electro-magnetics 79. Apparatus such as illustrated in FIGS. 3, 4, and 7, may be used to stir particles 10 on the conveyor. As the conveyor moves over the magnets, particles 12 and 16 are levitated. They are then swept toward the center for harvesting by arrangements previously described. Gas jets or pulsed magnets 84 located outside conveyor 76 may be used for directing particle movement. Funnel 80 in the center of the circular conveyor collects the particles and directs them to a receptacle such as a pan or conveyor 86. Stream 75 of particles 10 continues on around with the conveyor's travel, and particles not levitated to a state sufficiently high to be harvested are swept off conveyor 76 by diagonal strip 81 into collecting bin 82.

Several embodiments have been disclosed herein for carrying out the process of this invention. Different features are disclosed with respect to the embodiments. It is evident that some features disclosed with respect to one embodiment could be used with other embodiments. For example, the agitator of FIGS. 3 and 4 could be used in FIG. 7 or 9. The aeration principle in FIG. 7 could be used in FIG. 4 or 9. Harvesting aids, such as pulsed magnets, gas jets or paddles, are interchangeable from one embodiment to another. It will be understood that the embodiments and extent of levitation illustrations are not to scale.

To further define the invention and give the potential user of the apparatus and process information on extent of levitation for different materials at various magnet strengths of fields the following table is provided. A mixture of superconducting material ($Y\ Ba_2\ Cu_3\ O_{6.86}$) and non-superconducting alumina ($Al_2\ O_3$), both in powdered form, were deposited in a tube above a magnet. The materials acted as follows:

| Material | Tube Dia. | Magnet Gauss | Material Temp. | Levitation Height | Particle Size |
|---|---|---|---|---|---|
| | | EXAMPLE I | | | |
| $Y Ba_2Cu_3O_{6.86}$ | 6 mm | 3000 | 77–92.5K | 6 mm | .5–1.5 mm |
| $Al_2O_3$ | 6 mm | 3000 | 77–92.5K | 0 mm | .5–1.0 mm |
| | | EXAMPLE II | | | |
| $Y Ba_2Cu_3O_{6.86}$ | 30 mm | 3000 | 77–92.5K | 5 mm | .5– |
| $Al_2O_3$ | 30 mm | 3000 | 77–92.5K | 0 mm | .5–1.0 mm |

Superconducting material, still in powdered form after having been subjected to the beneficiation process, may then be sintered and fashioned by processes known in the art to form a superconductor for carrying electricity at low loss.

Having thus described our invention with respect to several arrangements for carrying out the process thereof, it will be appreciated that the disclosures are intended to be illustrative only and that numerous interchanges or alternate embodiments may be constructed by those skilled in the art without departing from the scope and spirit of the invention which is limited only by the claims which follow.

We claim:

1. A process for beneficiation of superconducting material in particulate form wherein some particles are more superconducting than others, comprising:
   - generating a strong vertically directed magnetic field above a source;
   - reducing the temperature of the superconducting material to at least a critical temperature ($T_c$) thereof;
   - introducing the material into the magnetic field and maintaining the material within said field oriented so that the superconducting particles are levitated therein above the source at elevation states depending upon their respective superconductivity to enable separation of particles at selected elevation states from the mixture.

2. The process according to claim 1 wherein said separation is effected by sweeping levitated particles laterally out of the magnetic field.

3. The process according to claim 1 wherein said separation is said separation by selectively varying the strength of the vertically directed magnetic field progressively laterally across the source to sweep levitated particles to one side.

4. The process according to claim 2 wherein sweeping is further defined by pulsing the magnetic field strength progressively across the source.

5. The process according to claim 2 wherein sweeping of levitated particles is further defined by generating a laterally directed magnetic pulse against the particles.

6. The process according to claim 2 wherein sweeping of levitated particles is further defined by generating a laterally directed magnetic pulse against the particles.

7. The process of claim 2 wherein sweeping is further defined by the step of blowing the levitated particles laterally out of levitation state.

8. The process according to claim 1 wherein introducing the material into the magnetic filed is further defined by the step of conveying a continuous stream of particulate material into the magnetic field.

9. The process according to claim 8 further defined by agitating the stream of particulate material while in the influence of the magnetic field.

10. A process for beneficiation of superconducting material in particulate form wherein some particles are more superconducting than others, comprising:

generating magnetic fields having vertical components above sources in linear array;

conveying a stream of material at superconducting temperature through magnetic fields along the array whereby superconducting particles thereof are levitated according to the Meissner Effect at states above the sources depending upon respective particle superconducting characteristics; and, harvesting particles levitates too the higher states.

11. The processing according to claim 10 wherein harvesting of higher state particles is further defined by the step of sweeping the particles out of levitation.

12. The process according to claim 11 further defined by pulsing the vertical magnetic fields to establish a lateral traveling wave to sweep levitated particles to one side.

13. A superconductor formed by the process comprising:

selecting a material in powdered form which has overall superconducting characteristics;

subjecting the powdered material to beneficiation by the steps of:

(1) cooling the powdered material to a temperature to below the critical temperature ($T_c$) thereof;

(2) introducting the powdered material into a vertically directed magnetic field above a source whereby particles thereof which are more superconducting are levitated in the magnetic field according to the Meissner Effect at higher states above the source than are particles which are less superconducting; and, 2) harvesting the particles from the higher states; and, sintering the harvested particles into a form for carrying electricity at low loss.

14. A method of enhancing the volume percentage of a selected superconductive phase in a multiphase material having at least one superconductive phase, said method comprising the steps of:

providing the multiphase material as a mixture of granules;

maintaining the granules at a temperature where at least the selected superconductive phase exhibits superconductivity;

applying a magnetic field to the mixture to exert diamagnetic force selectively upon the granules containing the selected superconductive phase; and confining the mixture oriented within said magnetic field to enable separation of at least a portion of said granules thereof containing the selected superconductive phase by exertion of said diamagnetic force thereon.

* * * * *